(12) United States Patent
Letavic et al.

(10) Patent No.: US 6,221,737 B1
(45) Date of Patent: Apr. 24, 2001

(54) METHOD OF MAKING SEMICONDUCTOR DEVICES WITH GRADED TOP OXIDE AND GRADED DRIFT REGION

(75) Inventors: Theodore Letavic, Putnam Valley; Mark Simpson, Ossining, both of NY (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/408,786

(22) Filed: Sep. 30, 1999

(51) Int. Cl.[7] .................................................. H01L 21/76
(52) U.S. Cl. .......................... 438/439; 438/297; 438/225; 257/347; 257/335
(58) Field of Search ................................. 438/297, 437, 438/439, 427, 225; 257/347, 335

(56) References Cited

U.S. PATENT DOCUMENTS

| | | | |
|---|---|---|---|
| 4,247,860 | * 1/1981 | Tihanyi | 357/23 |
| 5,246,870 | 9/1993 | Merchant | 437/21 |
| 5,378,912 | * 1/1995 | Pein | 257/343 |
| 5,412,241 | 5/1995 | Merchant | 257/409 |
| 5,422,505 | 6/1995 | Shirai | 257/327 |
| 5,541,435 | * 7/1996 | Beasom | 257/409 |
| 5,648,671 | 7/1997 | Merchant | 257/347 |
| 5,780,900 | * 7/1998 | Suzuki et al. | 257/335 |
| 5,985,734 | * 11/1999 | Hahn | 438/425 |

FOREIGN PATENT DOCUMENTS

| | | |
|---|---|---|
| 09252123 | 9/1997 | (JP) . |
| 10135466 | 5/1998 | (JP) . |
| 10163496 | 6/1998 | (JP) . |

OTHER PUBLICATIONS

PHA 23,337, U.S. Ser. No. 08/998,048, Filed: Dec. 24, 1997.
PHA 23,424A, U.S. Ser. No. 09/100,832, Filed: Apr. 30, 1999.

* cited by examiner

*Primary Examiner*—Charles Bowers
*Assistant Examiner*—David S Blum
(74) *Attorney, Agent, or Firm*—Steven R. Biren

(57) ABSTRACT

A method of making a semiconductor device such as a diode or MOSFET provided in a thin semiconductor film on a thin buried oxide is disclosed, in which the lateral semiconductor device structure includes at least two semiconductor regions separated by a lateral drift region. A top oxide insulating layer is provided over the thin semiconductor film and a conductive field plate is provided on the top oxide insulating layer. In order to provide enhanced device performance, a portion of the top oxide layer increases in thickness in a substantially continuous manner, while a portion of the lateral drift region beneath the top oxide layer decreases in thickness in a substantially continuous manner, both over a distance which is at least about a factor of five greater than the maximum thickness of the thin semiconductor film. This structure is achieved by a method including the steps of forming an oxidation mask including silicon nitride on the thin semiconductor film, and then patterning a portion of the oxidation mask with a series of sequential openings of different widths, a portion of the openings having a width less than the maximum thickness of the top oxide insulation layer. The thin semiconductor film is then oxidized using the oxidation mask to grow the top oxide insulation layer and lateral drift region portions which change in thickness.

17 Claims, 1 Drawing Sheet

METHOD OF MAKING SEMICONDUCTOR DEVICES WITH GRADED TOP OXIDE AND GRADED DRIFT REGION

BACKGROUND OF THE INVENTION

The invention is in the field of Semiconductor devices, and relates more specifically to a method of making devices such as MOSFETS and diodes, including SOI devices, suitable for high-voltage and power applications.

In fabricating high-voltage power devices, tradeoffs and compromises must typically be made in areas such as breakdown voltage, size, conduction losses and manufacturing simplicity and reliability. Frequently, improving one parameter, such as breakdown voltage, will result in the degradation of another parameter, such as conduction losses. Ideally, such devices would feature superior characteristics in all areas, with a minimum of operational and fabrication drawbacks.

Improvements over a basic structure, in which increased breakdown voltages are achieved by providing a linear doping profile in the drift region, are shown in related U.S. Pat. No. 5,246,870 and U.S. Pat. No. 5,412,241, both commonly assigned with the instant application and incorporated herein by reference. In these SOI devices, the drift region between the channel and drain in a lateral MOS structure is provided with various features, such as a thinned portion and a linear lateral doping density profile, which result in substantially increased breakdown voltage characteristics. Additionally, a top field plate is provided over a field oxide of essentially constant thickness to permit twice the conducting charge to be placed in the drift region, thereby reducing conduction losses without reducing breakdown voltage. However, to maintain high breakdown voltage, the total amount of conduction charge near the source side of the drift region must be kept very small, thereby leading to a bottleneck for current flow and preventing optimum reduction in conduction losses.

Another improvement over the basic SOI structure is shown in U.S. Pat. No. 5,648,671, also commonly assigned with the instant application and incorporated herein by reference. This patent shows a lateral thin-film SOI device with a linearly-graded field oxide region and a linear doping profile, features which serve to reduce conduction losses without reducing breakdown voltage. Yet another improved high-voltage thin-film device is disclosed in U.S. patent application Ser. No. 08/998,048, commonly assigned with the instant application, co-invented by the present inventors and incorporated herein by reference. This application discloses another technique for improving such devices, employing a step oxide region of intermediate thickness to increase current-carrying capability while maintaining a high breakdown voltage.

While all of the foregoing structures offer an improvement over standard SOI structures, they still suffer from the drawback that they cannot operate effectively and efficiently at high current levels in the source-follower mode, wherein a "source-high" bias condition may be encountered during operation and a high breakdown voltage must be maintained in a device which must also handle high current levels.

A lateral thin-film SOI device configuration of the type described above, but in which operation, and particularly operation of a MOSFET device in the source-follower mode, is enhanced by significantly increasing permissible saturated current flow and reducing the on resistance of the device structure while maintaining high breakdown voltage capability, is described in allowed U.S. patent application Ser. No. 09/100,832, filed Jun. 19, 1998 by the present inventors, commonly assigned with the instant application, and incorporated herein by reference in its entirety. The advantages of the foregoing structures are achieved by providing the disclosed structures with both a graded top oxide and a graded drift region. While devices of this type can be made using conventional prior-art doping and LOCOS techniques, as noted in Applicants' earlier application, such prior-art techniques are relatively complex, expensive and time consuming.

Accordingly, it would be desirable to have a method of making semiconductor devices with a graded top oxide and a graded drift region using a relatively simple, economical and rapid fabrication process.

SUMMARY OF THE INVENTION

It is therefore an object of the invention to provide a method of making a semiconductor device, such as a MOSFET or a power diode, capable of improved performance, by virtue of a design configuration which results in a significant increase in the saturated current flow and a reduction in the minimum attainable specific on resistance of the device structure without compromising the breakdown voltage capability of the device.

It is a further object of the invention to provide a method of making a semiconductor device with a graded top oxide and a graded drift (or other underlying semiconductor) region in order to achieve improve performance, with the method being simpler, more economical and more rapid than presently-known methods.

In accordance with the invention, these objects are achieved, for example, in a semiconductor device of the type having a semiconductor substrate, a thin buried oxide insulating layer on the substrate, and a lateral semiconductor device provided in a thin semiconductor film on the thin buried oxide. The thin semiconductor film includes a first region of a first conductivity type, a second region of a second conductivity type opposite to that of the first and spaced apart from the first region by a lateral drift region of the second conductivity type, a top oxide insulating layer over the thin semiconductor film, and a conductive field plate on the top oxide insulating layer. In accordance with the invention, the objects discussed above are achieved by a method of providing the top oxide insulating layer with a layer portion adjacent the first region which increases in thickness in a substantially continuous manner in a direction from the first region toward the second region over a distance of at least about a factor of five greater than a maximum thickness of the top oxide insulating layer, and by providing the lateral drift region with a region portion adjacent the first region which decreases in thickness in the same substantially continuous manner in a direction from the first region toward the second region and over the same distance. Such a configuration provides a substantially thicker semiconductor film region adjacent the first region and also provides a substantially thinner top oxide insulating layer in this region. Additionally, such a device configuration avoids sharp edges and steep slopes in the oxide and semiconductor film layers in this region. These features, in combination, result in the performance advantages discussed above, which are of particular importance in source-follower mode operation of MOSFET devices.

In accordance with the invention, the foregoing features are achieved by a method including the steps of forming an oxidation mask including silicon nitride on the thin semiconductor film and then patterning a portion of the oxidation mask with a series of sequential openings of different widths, a portion of the openings having a width less than the maximum thickness of the top oxide insulation layer. The thin semiconductor film is then oxidized using the oxidation mask to grow the top oxide insulation layer and lateral drift region portions which change in thickness.

In a preferred embodiment of the invention, the method is used to fabricate a MOSFET device, while in a further preferred embodiment of the invention the method is used to fabricate a diode, in which case the devices made in accordance with the method of the invention will provide enhanced performance due to a reduced forward voltage drop at a given current (thus reducing conduction losses) and can also increase diode breakdown voltage.

In further preferred embodiments of the invention, the increases and decreases in thickness described above may occur in either a substantially linear manner, or in a non-linear manner such as in accordance with a square-root function.

In yet a further preferred embodiment of the invention only a single oxidation mask is formed and patterned, and a single thermally oxidizing step is performed to grow the top oxide insulation layer. Preferably, a portion of the openings formed by this patterning will have a width of less than about 2 microns, and preferably a width of about 0.4 microns.

Thus, semiconductor devices made in accordance with the method of the present invention offer a significant improvement in that high current and high voltage handling capability is substantially enhanced, and in particular in that source-follower operation of MOSFET devices is substantially enhanced. Additionally, the method of the present invention permits such devices to be made in a simple, rapid and economical fashion.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
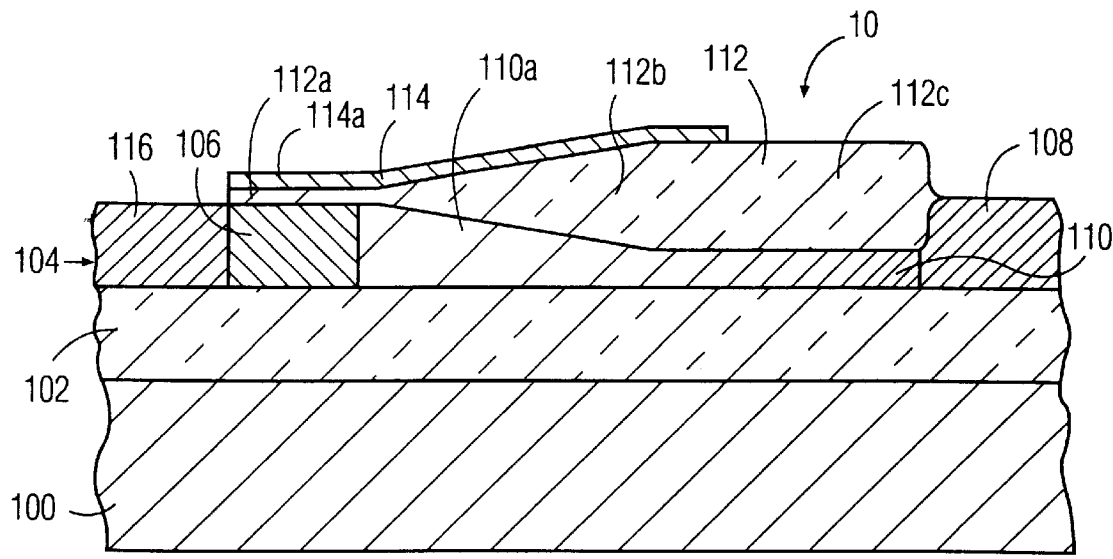
FIG. 1 shows a simplified cross-sectional view of a lateral SOI MOSFET device made in accordance with a first embodiment of the invention.

In the drawing, semiconductor regions having the same conductivity type are generally shown hatched in the same direction, and it should be noted that the figures are not drawn to scale.

DESCRIPTION OF THE PREFERRED EMBODIMENTS

A lateral thin-film SOI MOSFET structure 10 made in accordance with the instant method invention is shown in simplified crosssection in FIG. 1. This structure includes a semiconductor substrate 100, typically of n-type silicon material having a doping concentration of $10^{18}$–$10^{20}$ at /cm$^3$, on which is provided a thin buried oxide insulating layer 102, typically a silicon oxide layer of between about 0.1 micron and 5.0 microns thickness. In the device shown, insulating layer 102 may advantageously have a thickness in the range of 2–3 microns.

A thin semiconductor film 104 is provided on insulating layer 102 and has a thickness in the range of about 0.1–2.0 micron, with a lateral semiconductor device, in this case a MOSFET provided in the thin semiconductor film 104. In the embodiment shown in FIG. 1, the thin semiconductor film 104 includes a first region 106, here of p-type conductivity and having a doping level of about $10^{17}$ at /cm$^3$, which serves as a channel region of the device. A drain of the device is formed by a second region 108, here of n-type conductivity and having a doping level of about $10^{18}$ at /cm$^3$. The second region 108 is spaced apart from the first region 106 by a semiconductor lateral drift region 110, here of n-type conductivity and in this example having a substantially linear lateral doping profile, with a charge concentration of about $1.0 \times 10^{12}$ at /cm$^2$ at its left (channel) side and a charge concentration of about $2.0 \times 10^{13}$ at /cm$^2$ at its right (drain) side.

In general, the doping level in the lateral drift region should increase linearly by a factor of at least about 40 in high voltage devices.

In the MOSFET embodiment of FIG. 1, thin semiconductor film 104 additionally includes a third region 116 of n-type conductivity located alongside the first region 106 at a side thereof remote from the lateral drift region 110. This third region, which forms the source region of MOSFET transistor 10, can have a doping level substantially equal to that of second region 108 (which forms the drain region of the MOSFET device), in this example about $10^{18}$ at cm$^3$. Additionally, a conductive field plate 114 over the top oxide insulating layer 112 extends over and parallel to channel region 106 to form a gate electrode of the MOSFET device. The portion of the conductive field plate 114 which extends over and parallel to the channel region 106 is designated by reference numeral 114a in FIG. 1, and is insulated from the thin semiconductor film 104 by a thin portion 112a of top oxide insulating layer 112, which forms a gate oxide and is of constant thickness, here about 0.1 micron or less.

The top oxide insulating layer 112 is provided over the thin semiconductor film 104 and has a substantially tapered portion 112b over a portion of lateral drift region 110 which increases in thickness from adjacent the first region 106 toward the second region 108. In the present example, the thickness of the top oxide insulating layer 112 varies from a minimum of about 0.05 micron at the area 112a adjacent the first region 106 to about 2 microns (depending upon the thickness of film 104) at the area 112cadjacent the second region 108.

Advantageously, the maximum thickness of the top oxide insulting layer 112, at the area 112c, can be made substantially equal to the thickness of thin buried oxide insulting layer 102.

In accordance with the method of the invention (and directly contrary to the structure in U.S. Pat. No. 5,648,671), the portion of the top oxide insulating layer 112b adjacent the first region 106 is made to increase in thickness in a substantially continuous manner in a direction from the first region toward the second region 108 by having both its upper and lower surfaces tapering outwardly, over a distance that may typically be at least about a factor of five greater than the maximum thickness of the top oxide insulating layer. Likewise, and as a direct result of the tapered lower surface of the top oxide insulating layer 112 in the region 112b, the lateral drift region 110 has a corresponding region portion 110a adjacent the first region 106 which has a corresponding decrease in thickness in a substantially continuous manner in the direction from the first region toward the second region. Typically, this tapering of both the top oxide insulating layer and the lateral drift region will occur over a distance which is at least about a factor of five greater than the maximum thickness of the thin semiconductor film 104. Additionally, while the tapered edges of the top oxide insulating layer and the SOI lateral drift region (112b, 110a) are shown in the simplified figures as smooth, devices manufactured in accordance with the invention will typically feature scalloped surfaces in this region as a result of the method used. While it should be understood that a wide range of dimensional values are contemplated within the scope of the invention, the thin semiconductor film 104 may have a maximum thickness of about 1.5 micron, with the maximum thickness of the top oxide insulating layer portion 112c having a maximum thickness of about 2.0 microns, in which case the lateral drift region 110 will have a minimum thickness of about 0.45 micron at its right-hand side.

The conductive field plate 114 located on the top of the top oxide insulating layer 112 may be made of polysilicon, polysilicon and metal, or other suitable conductive materials. It should be understood that although a particular lateral extent of the conductive field plate is shown in the figures, different lateral extents may be used to achieve different operating characteristics as desired.

Electrical connections to the conductive field plate 114, as well as the various semiconductor regions and the substrate 100 are made in a conventional manner well known to those of ordinary skill in this art and are accordingly not shown or described further here.

Figure 2:
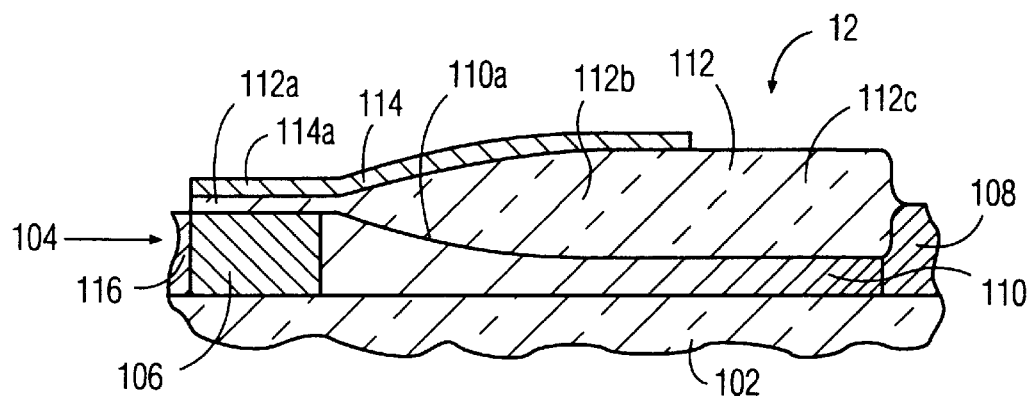
FIG. 2 shows a simplified cross-sectional view of a portion of a lateral SOI MOSFET device made in accordance with a second embodiment of the invention.

It is within the contemplated scope of the invention that the variation in thickness of the top oxide insulating layer 112 and the lateral drift region 110 may vary in different, but substantially continuous, manners. Thus, in the embodiment shown in FIG. 1, this variation in thickness takes the form of a substantially linear variation, while in the partial simplified cross-sectional view of FIG. 2, a device 12 is shown which is generally similar to the device shown in FIG. 1 except that the variation in thickness, at the portions designated 110a and 112b, is shown as a substantially nonlinear variation, such as a square-root function. The precise manner of the variation in thickness to be selected will be a function of the particular device parameters to be achieved, as will be apparent to those of ordinary skill in the art.

Figure 3:
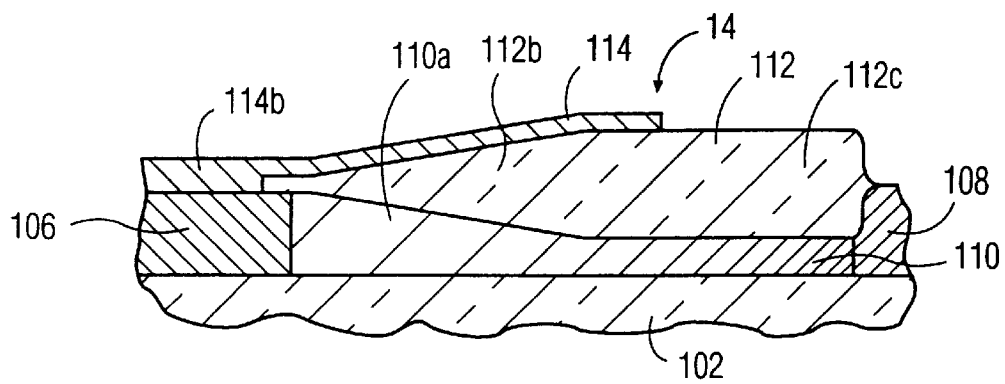
FIG. 3 shows a simplified cross-sectional view of a lateral SOI diode device made in accordance with a third embodiment of the invention.

Yet another embodiment made in accordance with the method of the invention, in the form of a lateral thin-film SOI diode structure 14, is shown in simplified partial cross-section in FIG. 3. This diode structure is similar to the structures previously described, and in particular FIG. 1, except that the source region 116 has been eliminated, and the conductive field plate 114 has a portion 114b which contacts first region 106, which in this embodiment serves as an anode of the diode device. The cathode of the device is formed by second region 108, and in other respects the device is similar to that shown in FIG. 1 and accordingly will not be described in further detail. As in the MOSFET embodiments previously described, the variations in thickness of the top oxide insulating layer and the lateral drift region may be either linear (as shown) or nonlinear variations.

Devices in accordance with the present invention achieve the advantages of significantly increasing permissible saturated current flow and reducing the on resistance of the device structure while improving high breakdown voltage capability. This is accomplished by providing a substantially thicker semiconductor film region adjacent the first region and also providing a substantially thinner top oxide insulating layer in this region. Additionally, by tapering the semiconductor film and top oxide insulating layer over a substantially greater lateral distance than in the prior art, and in a substantially continuous manner, sharp edges and steep slopes in the oxide and semiconductor film layers are avoided in this region, thus increasing breakdown voltage. These features, in combination, result in a substantially improved device structure, featuring the performance advantages discussed above.

While devices of the types described above may be manufactured in accordance with conventional processing techniques, as noted in our earlier application, by using the method of the present invention such devices may be fabricated in a simpler, more rapid, and more economical fashion. In particular, by using the particular characteristics of a thermal oxidation process (and in particular a LOCOS or Local Oxidation of Silicon Process), a single mask and a single oxidation step may be used to form both the portion of the top oxide insulating layer which increases in thickness and the portion of the lateral drift region which decreases in thickness, thus resulting in a simpler, faster and more economical processing technology.

In connection with the following description of the method invention, it should be noted that although certain specific device configurations have been shown and described, the method has generic application in fabricating both SOI devices and devices other than SOI devices. Other applications of the method of the instant invention include, for example, the fabrication of a low-capacitance gate construction for vertical power devices (VDMOS), and a near-ideal high-voltage termination structure for vertical power devices.

In the context of fabricating SOI devices, such as those described above, the method of the present invention differs from the prior art in the steps involved with forming the top oxide insulating layer portion and lateral drift region portion which are of nonconstant thickness.

This is accomplished by first forming an oxidation mask, typically formed by growing a pad oxide layer on the thin semiconductor film and then depositing a silicon nitride layer on the pad oxide layer, in accordance with conventional LOCOS technology. A portion of the oxidation mask, above the region where layers of nonconstant thickness are to be formed, is then patterned with a series of sequential openings of different widths, with at least some of the these openings having a width less than the maximum thickness of the top oxide insulation layer to be grown. The thin semiconductor film is then thermally oxidized using the oxidation mask to grow the top oxide insulation layer from a portion of the thin semiconductor film. Since less oxide will grow beneath oxidation mask portions with smaller openings, as described in further detail below, this method can be used to form the top oxide insulation layer and lateral drift region with portions which are of nonconstant thickness. Furthermore, by appropriately selecting the widths of the various openings in the oxidation mask, various different top oxide insulation layer and lateral drift region shapes can be obtained.

Advantageously, a portion of the openings in the oxidation mask will have a width less than the maximum thickness of the top oxide insulation layer, typically about 2 microns, and some of the openings may advantageously have a width of as little as about 0.4 microns. In this manner, a single masking step and a single thermal oxidation step are used to form both the top oxide insulation layer portion and the lateral drift region portion of nonconstant thickness, a substantial simplification over prior-art methods.

The present method invention is based upon the recognition of the fact that if some of the openings in the oxidation mask are made narrower than the maximum thickness of the top oxide insulation layer to be grown, the oxidation rate beneath these portions of the oxidation mask will be smaller than the oxidation rate in unmasked silicon. Since the oxidation rate is a function of the pattern of openings, judicious selection of pattern geometry can be used to construct a thermal oxide layer in which the thickness can be tailored to a desired configuration in the lateral direction. Thus, for example, in the devices shown either a square-root or a linear functional dependence can be achieved by appropriate selection of the pattern of widths of the openings in the oxidation mask. Furthermore, since it is inherent in the oxidation process that silicon is consumed as oxide is grown, the underlying silicon or SOI layer will automatically and simultaneously be configured with a nonconstant thickness as the top oxide insulation layer portion of nonconstant thickness is grown, thus forming two regions with a single mask and a single oxidation step.

While this will be recognized that the invention is applicable to a wide range of values and process parameters, in a typical LOCOS process a 600 angstrom pad oxide will be grown, with a 1400 angstrom silicon nitride layer deposited on the pad oxide. A desired pattern of openings is then formed in the oxidation mask, followed by a high-temperature thermal oxidation step to grow the oxide in the desired configuration. Whereas patterned openings in the oxidation mask are typically about 50 microns wide for a high breakdown voltage device, much wider than the thickness of the thermal oxide to be grown, in the present invention a portion of the openings have a width less than the maximum thickness of the top oxide insulation layer, which may typically be about 2 microns. Thus, unlike the prior-art situation, in which the patterned openings in the oxidation mask are typically much wider than the thickness of the thermal oxide to be grown, the small openings of the present method invention will result in less oxide being grown beneath the patterned openings. Thus, for example, if a thermal oxidation process is used which will grow 2.2 microns of oxide in a prior art large-width opening, only about 1 micron of oxide will grow in a narrow-width opening on the order of 0.4 microns. The reason for this is that for large openings, vertical diffusion sets the oxidation rate, whereas for small openings (i.e. those less than the oxide thickness) lateral diffusion sets the oxidation rate. This anomaly in the LOCOS process is used in the present invention to create devices having the contoured oxide and SOI layers of nonconstant thickness as shown in the drawing.

As a further refinement of the invention, by appropriately patterning the series of small openings in the oxidation mask, the contour of the resulting oxide and SOI layer thickness can be controlled, thus grading the oxide and silicon in accordance with a desired contour. Some examples of advantageous contours, as noted above, entail thickness variations in a linear manner and in a square-root manner. For the contours shown in the drawing, it will be apparent that the width of the openings in the oxidation mask will increase in width from left to right over the region to be graded, thereby resulting in an oxide thickness which increases from left to right and a corresponding SOI layer thickness which decreases from left to right. This has the net effect of grading both the oxide thickness and the SOI thickness over the lateral region in which the openings of varying width are present, while employing only a single mask and a single oxidation process.

In the foregoing manner, the present invention provides a method of fabricating various types of semiconductor devices having enhanced performance characteristics using a process which is simple, rapid and economical to implement.

While the invention has been particularly shown and described with reference to several preferred embodiments thereof, it will be understood by those skilled in the art that various changes in form and detail may be made without departing from the spirit or scope of the invention. In this application it should be understood that the word "a" or "an" preceding an element does not exclude the presence of a plurality of such elements, and that the word "comprising" does not exclude the presence of other elements or steps than those described or claimed.

What is claimed is:

1. A method of making a semiconductor device having a semiconductor substrate, a thin buried oxide insulating layer on said substrate, and a lateral semiconductor device provided in a thin semiconductor film on said thin buried oxide, said thin semiconductor film comprising a first region of a first conductivity type, a second region of a second conductivity type opposite to that of the first and spaced apart from said first region by a lateral drift region of said second conductivity type, a top oxide insulating layer over said thin semiconductor film, and a conductive field plate on said top oxide insulating layer, wherein said top oxide insulating layer comprises a layer portion adjacent said first region which increases in thickness in a substantially continuous manner in a direction from said first region toward said second region over a distance of at least about a factor of five greater than a maximum thickness of said thin semiconductor film, and said lateral drift region comprises a region portion adjacent said first region which decreases in thickness in said substantially continuous manner in a direction from said first region toward said second region over said distance, the method comprising:

forming an oxidation mask comprising silicon nitride on said thin semiconductor film; then patterning a portion of said oxidation mask with a series of sequential openings of different widths, a portion of said openings having a width less than a maximum thickness of said top oxide insulation layer; and then thermally oxidizing said thin semiconductor film using said oxidation mask to grow said top oxide insulation layer with said layer portion which increases in thickness and to form said lateral drift region with said region portion which decreases in thickness.

2. A method of making a semiconductor device as claimed in claim 1, wherein said device comprises a diode, said field plate is connected to said first region, which forms a first electrode of said diode, and said second region forms a second electrode of said diode.

3. A method of making a semiconductor device as in claim 2, wherein a maximum thickness of said top oxide insulating layer is substantially equal to a thickness of said thin buried oxide insulating layer.

4. A method of making a semiconductor device as claimed in claim 1, wherein said device comprises a MOSFET, said thin semiconductor film further comprises a third region of said second conductivity type alongside said first region at a side thereof remote from said lateral drift region, said conductive field plate extends over and is insulated from said first region to form a gate electrode of said MOSFET, and said third and second regions form a source and a drain region of said MOSFET.

5. A method of making a semiconductor device as in claim 4, wherein a maximum thickness of said top oxide insulating layer is substantially equal to a thickness of said thin buried oxide insulating layer.

6. A method of making a semiconductor device as claimed in claim 1, wherein a doping level of said lateral drift region increases linearly in a direction from said first region to said second region.

7. A method of making a semiconductor device as in claim 6, wherein said doping level increases linearly by a factor of at least about 40.

8. A method of making a semiconductor device as in claim 1, wherein said layer portion of the top oxide insulating layer increases in thickness in a substantially linear manner, and said region portion of the lateral drift region decreases in thickness in said substantially linear manner.

9. A method of making a semiconductor device as in claim 1, wherein said layer portion of the top oxide insulating layer increases in thickness in a substantially nonlinear manner, and said region portion of the lateral drift region decreases in thickness in said substantially nonlinear manner.

10. A method of making a semiconductor device as in claim 9, wherein said nonlinear manner comprises a square-root function.

11. A method of making a semiconductor device as in claim 1, wherein only a single oxidation mask is formed and patterned, and a single thermally oxidizing step is performed to grow the top oxide insulation layer.

12. A method of making a semiconductor device as in claim 1, wherein said thermally oxidizing step comprises a LOCOS (Local Oxidation of Silicon) step.

13. A method of making a semiconductor device as in claim 12, further comprising forming said oxidation mask by growing a pad oxide layer on said thin semiconductor film and then depositing a silicon nitride layer on said pad oxide layer.

14. A method of making a semiconductor device as in claim 1, wherein a portion of said openings have a width of less than about 2 microns.

15. A method of making a semiconductor device as in claim 14, wherein a portion of said openings have a width of about 0.4 microns.

16. A method of making a semiconductor device as in claim 1, further comprising the step of forming said conductive field plate on said top oxide insulation layer portion.

17. A method of making a semiconductor device having an oxide insulation layer, comprising the steps of forming an oxidation mask on a semiconductor layer, then patterning a portion of said oxidation mask with a series of sequential openings of different widths, a portion of said openings having a width less than a maximum thickness of said oxide insulation layer, and then thermally oxidizing said semiconductor layer using said oxidation mask to grow said oxide insulation layer, thereby providing both said oxide insulation layer and said semiconductor layer with a nonconstant thickness beneath said portion of said oxidation mask.

* * * * *